(12) United States Patent
Archie et al.

(10) Patent No.: US 7,340,374 B2
(45) Date of Patent: Mar. 4, 2008

(54) DETERMINING FLEET MATCHING PROBLEM AND ROOT CAUSE ISSUE FOR MEASUREMENT SYSTEM

(75) Inventors: Charles N. Archie, Granite Springs, NY (US); George W. Banke, Jr., Essex Junction, VT (US); Eric P. Solecky, Hyde Park, NY (US)

(73) Assignee: International Business Machines corporation, Armonk, NY (US)

( * ) Notice: Subject to any disclaimer, the term of this patent is extended or adjusted under 35 U.S.C. 154(b) by 273 days.

(21) Appl. No.: 11/065,740

(22) Filed: Feb. 25, 2005

(65) Prior Publication Data

US 2006/0195294 A1    Aug. 31, 2006

(51) Int. Cl.
*G06F 17/18* (2006.01)
(52) U.S. Cl. .................... 702/179; 702/121
(58) Field of Classification Search .......... 702/179, 702/118, 121
See application file for complete search history.

(56) References Cited

U.S. PATENT DOCUMENTS

| | | | |
|---|---|---|---|
| 5,526,293 A * | 6/1996 | Mozumder et al. ........ 716/19 |
| 6,587,744 B1 * | 7/2003 | Stoddard et al. .......... 700/121 |
| 6,859,754 B2 * | 2/2005 | Shieh ...................... 702/179 |
| 6,885,977 B2 * | 4/2005 | Gavra et al. .............. 702/185 |
| 6,965,895 B2 * | 11/2005 | Smith et al. ................ 707/10 |
| 7,062,411 B2 * | 6/2006 | Hopkins et al. ........... 702/185 |
| 7,065,423 B2 * | 6/2006 | Prager et al. ............. 700/108 |
| 7,127,358 B2 * | 10/2006 | Yue et al. .................. 702/30 |
| 7,212,950 B2 * | 5/2007 | Poolla ...................... 702/183 |

\* cited by examiner

*Primary Examiner*—Hal Wachsman
*Assistant Examiner*—Anthony Gutierrez
(74) *Attorney, Agent, or Firm*—Lisa U. Jaklitsch; Hoffman, Warnick & D'Alessandro LLC

(57) ABSTRACT

Methods, systems and program products are disclosed for determining whether a measurement system under test (MSUT) matches a fleet including at least one other measurement system. The invention implements realistic parameters for analyzing a matching problem including single tool precision, tool-to-tool non-linearities and tool-to-tool offsets. A bottom-line tool matching precision metric that combines these parameters into a single value is then implemented. The invention also includes methods for determining a root cause of a matching problem, and for determining a fleet measurement precision metric.

23 Claims, 3 Drawing Sheets

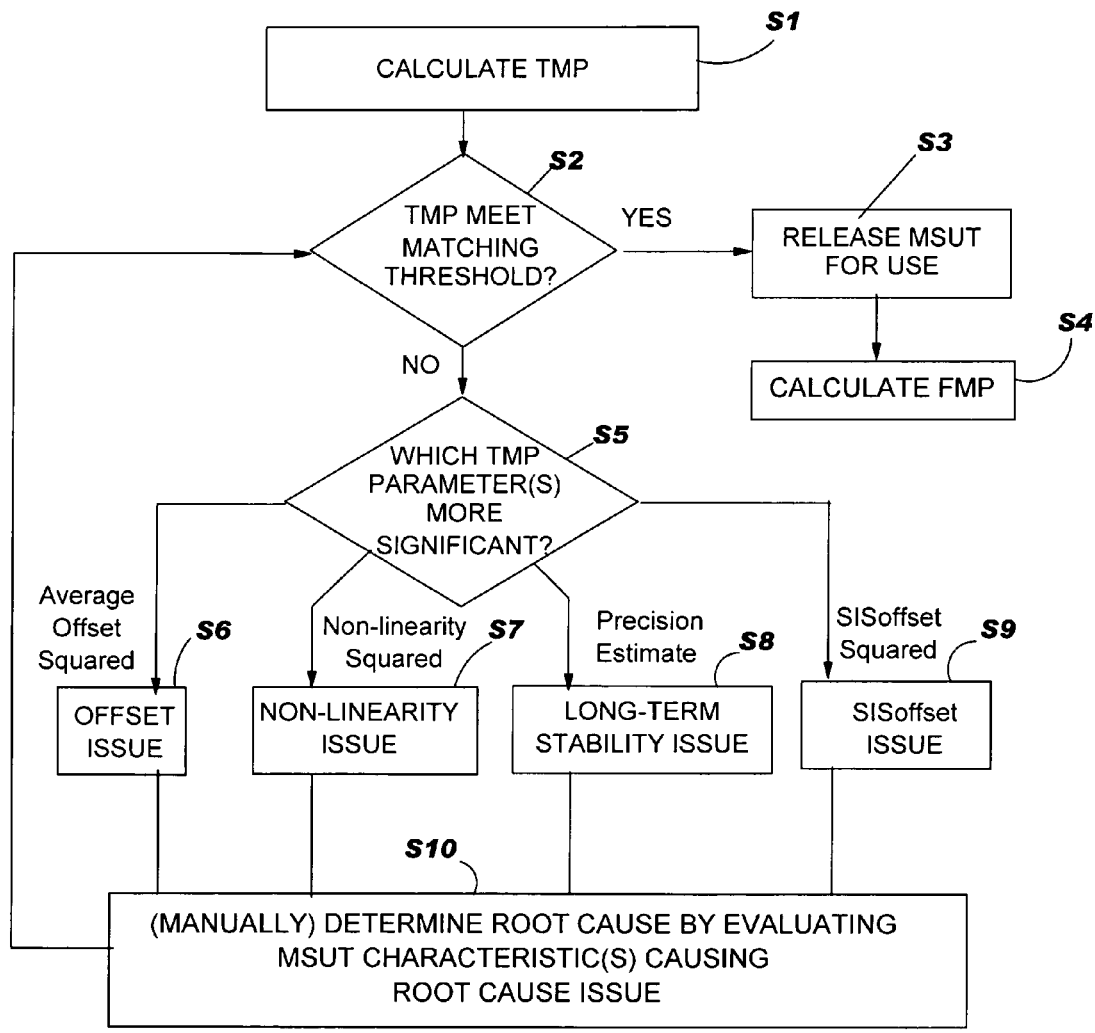

DETERMINING FLEET MATCHING PROBLEM AND ROOT CAUSE ISSUE FOR MEASUREMENT SYSTEM

BACKGROUND OF THE INVENTION

1. Technical Field

The present invention relates generally to measurement systems, and more particularly, to determining a matching problem of a measurement system under test to a fleet including at least one other measurement system, and also determining a root cause issue of the matching problem.

2. Related Art

Measurement systems are applied in a variety of industries in which precise and accurate measurements are required, such as semiconductor manufacturing. Challenges relative to attaining quality measurement are presented in terms of individual measurement systems and across a fleet of measurement systems.

In terms of individual measurement systems, each tool is typically required to achieve small tolerances to achieve better quality products and fewer rejections in the manufacturing process. For example, in the semiconductor manufacturing industry, the 1999 Edition of the International Technology Roadmap for Semiconductors (ITRS precision specification) lists the necessary precision needed for isolated line control in the year 2001 to be 1.8 nm. Correctly assessing and optimizing the measurement potential of a measurement system is difficult for a number of reasons. For example, an evaluator normally has limited access to the various instruments under consideration. In addition, each instrument needs to be evaluated under a wide range of conditions in order to gain a valid impression of how it will perform in the actual manufacturing setting. Finally, there are no widely accepted standards relative to the required parameters and how the parameters should be measured. One approach, disclosed in PCT Publication WO/2004/059247, which is hereby incorporated by reference, involves assessing and optimizing a measurement system by determining a total measurement uncertainty (TMU) based on precision and accuracy. The TMU is calculated based on a linear regression analysis and removing a reference measuring system uncertainty ($U_{RMS}$) from a net residual error. The fundamental question answered in the TMU PCT publication is how to correct or accurately determine how the measurement system under test or fleet under test measures. The TMU publication, however, does not address how similarly the measurement sytem under test matches the reference measurement system.

When quality measurement is evaluated across a fleet of measurement systems, the above-described challenges for assessing and optimizing a single metrology tool are multiplied. The ITRS precision specification referred to in the previous paragraph actually applies to whatever set of tools is used to monitor and control critical steps in the semiconductor manufacturing process. It is more cost effective to avoid dedicating tools to specific manufacturing steps by allowing any tool of the full fleet in the manufacturing line to make measurements. This, however, places great demand on achieving and maintaining good measurement matching for all tools in the fleet. Typically, measurement systems having similar measurement technology are selected for use together. Then, the measurement systems across a fleet are preferably manually matched as much as possible. In order to achieve matching, in one approach, an average offset value between measurements of tools within a fleet is minimized to match the tools as much as possible. A common practice is to compare measurements of a series of different design linewidths on a given wafer spanning the range of smallest to largest dimensions expected to be encountered in the manufacturing line, and then minimize the average difference (offset) between the measurements of different tools. One shortcoming of this approach is that there is insufficient information to understand the root cause of an unacceptable average offset. Another approach attempts to have instruments to be matched produce data having a straight line with unity slope and zero intercept or average offset when comparing measurements of different design linewidths. This approach is an improvement in that the slope provides magnification error information but also suffers from the problem that insufficient diagnostic information is generated to identify root causes of unacceptable matching. In addition, both approaches fail to produce a comprehensive metric that combines all relevant matching information. Another shortcoming in current practices is the use of simplified artifacts for the matching measurements. Matching artifacts are often chosen because they are stable, reliably manufactured, and with little process-induced variation. Unfortunately, these very properties imply they are not leading edge technology examples nor do they display the full range of measurement challenges present in manufacturing.

In view of the foregoing, there is a need in the art for improved methods that address the problems of the related art.

SUMMARY OF THE INVENTION

The invention includes methods, systems and program products for determining whether a measurement system under test (MSUT) matches a fleet including at least one other measurement system. The invention implements realistic parameters for analyzing a matching problem including single tool precision, tool-to-tool non-linearities and tool-to-tool offsets. A bottom-line tool matching precision metric that combines these parameters into a single value is then implemented. The invention also includes methods for determining a root cause issue of a matching problem, and for determining a fleet measurement precision metric.

The methodology is applicable to many metrology matching situations and the concepts of this invention can be applied to multiple measurement system types. Although the invention will be described relative to linewidths in the semiconductor industry, the measurand, i.e., the object to be measured, is not limited to this application. Further, the methodology is not restricted to tools of the same type. When the tools being compared are the same model, this is defined as homogeneous tool matching. Heterogeneous tool matching refers to this methodology applied across multiple generations or brands of metrology systems.

A first aspect of the invention is directed to a method of determining whether a measurement system under test (MSUT) matches a fleet including at least one other measurement system, the method comprising the steps of: calculating a tool matching precision based on a set of parameters including: a slope-induced shift offset (SISOffset) between a MSUT measurement of an artifact and a benchmark measurement of the artifact by a benchmark measurement system (BMS) and a non-linearity ($\sigma_{non-linearity}$) of a linear regression analysis comparing the MSUT and the BMS; and determining whether the tool matching precision meets a matching threshold, wherein the MSUT is considered matched in the case that the matching threshold is met.

A second aspect of the invention includes a system for determining whether a measurement system under test (MSUT) matches a fleet including at least one other measurement system, the system comprising: means for calculating a tool matching precision based on a set of parameters including: a slope-induced shift offset (SISOffset) between a MSUT measurement of an artifact and a benchmark measurement of the artifact by a benchmark measurement system (BMS) and a non-linearity ($\sigma_{non-linearity}$) of a Mandel regression analysis comparing the MSUT and the BMS; and means for determining whether the tool matching precision meets a matching threshold, wherein the MSUT is considered matched in the case that the matching threshold is met.

A third aspect of the invention related to a program product stored on a computer readable medium for determining whether a measurement system under test (MSUT) matches a fleet including at least one other measurement system, the computer readable medium comprising program code for performing the following steps: calculating a tool matching precision based on a set of parameters including: a slope-induced shift offset (SISOffset) between a MSUT measurement of an artifact and a benchmark measurement of the artifact by a benchmark measurement system (BMS) and a non-linearity ($\sigma_{non-linearity}$) of a Mandel regression analysis comparing the MSUT and the BMS; and determining whether the tool matching precision meets a matching threshold, wherein the MSUT is considered matched in the case that the matching threshold is met.

A fourth aspect of the invention is directed to a method of determining a root cause issue of a matching problem between a measurement system under test (MSUT) and a fleet of at least one other measurement system, the method comprising the steps of: calculating a tool matching precision indicative of an ability of the MSUT to match the fleet; determining that the tool matching precision does not meet a matching threshold; and determining the root cause issue of the matching problem based on an analysis of at least one parameter of the tool matching precision.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 3 shows a flow diagram of one embodiment of operational methodology for the system of FIG. 2.

DETAILED DESCRIPTION

The description includes the following headings for clarity purposes only: I. Introduction and Definitions, II. System Overview, III. Operational Methododology, and IV. Conclusion.

I. Introduction and Definitions

Figure 1:
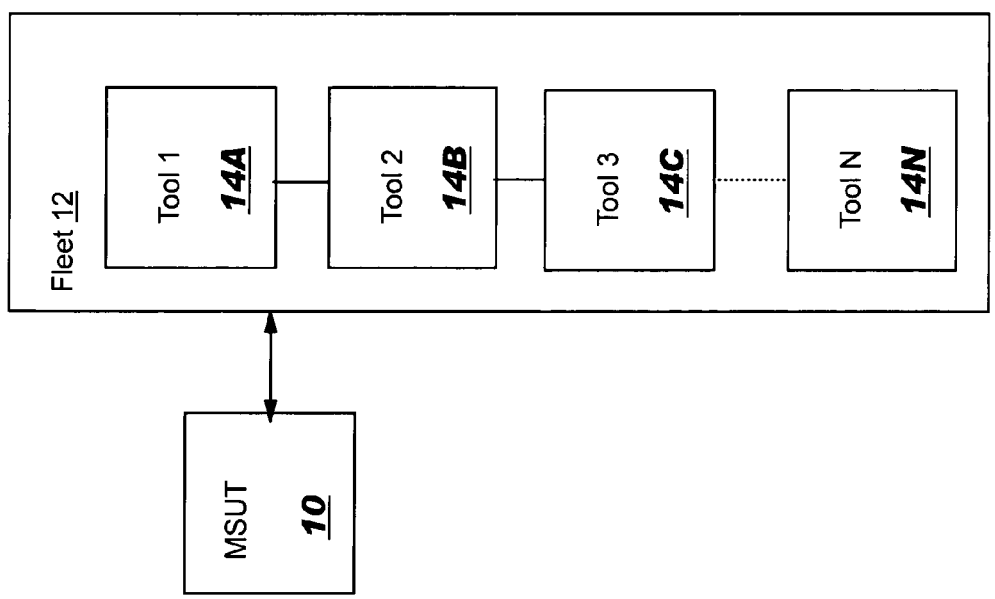
FIG. 1 shows an illustrative fleet measurement system environment.

Referring to FIG. 1, the invention includes methods, systems and program products for determining whether a measurement system under test (MSUT) 10 matches a fleet 12 including at least one other measurement system 14A-N, where N is the number of measurement systems in fleet 12. "Matches," as used herein means that MSUT 10 can perform the same measurement action as other tools of the fleet with comparable results. A "measurement system" or "measurement system under test" (hereinafter "MSUT") can be any measurement tool such as a critical dimension scanning electron microscope, an atomic force microscope, scatterometer, etc. Accordingly, it should be recognized that while particular types of measurement systems may be mentioned in the description, the teachings of the invention are applicable to any type of measurement system. In addition, while the invention will be described in the setting of the semiconductor industry, and in particular to critical dimension measurement systems, it should be recognized that the teachings of the invention are applicable to any industry or measurement system where measurement uncertainty is present and more than one tool is used to control a manufacturing setting, e.g., a manufacturing line. Similarly, a "fleet" including at least one measurement system may include a variety of measurement systems.

The invention implements realistic parameters for analyzing a matching problem of an MSUT to a fleet including single tool precision, tool-to-tool non-linearities and tool-to-tool offsets. The specifics of these generic parameters will be described in greater detail below. A bottom-line tool matching precision (TMP) metric that combines these parameters into a single value is then implemented. The TMP is indicative of an ability of the MSUT to match the fleet. Comparison of the TMP to a matching threshold indicates whether the MSUT is matched to the fleet. When an MSUT does not match, the invention implements methods for determining a root cause issue of the matching problem. Root cause issue determination generally leads to determining a root cause and corrective action to eliminate the problem.

The invention also implements a fleet measurement precision (FMP) based on fleet-specific parameters. The FMP provides an indication of the fleet's comprehensive precision.

II. System Overview

Figure 2:
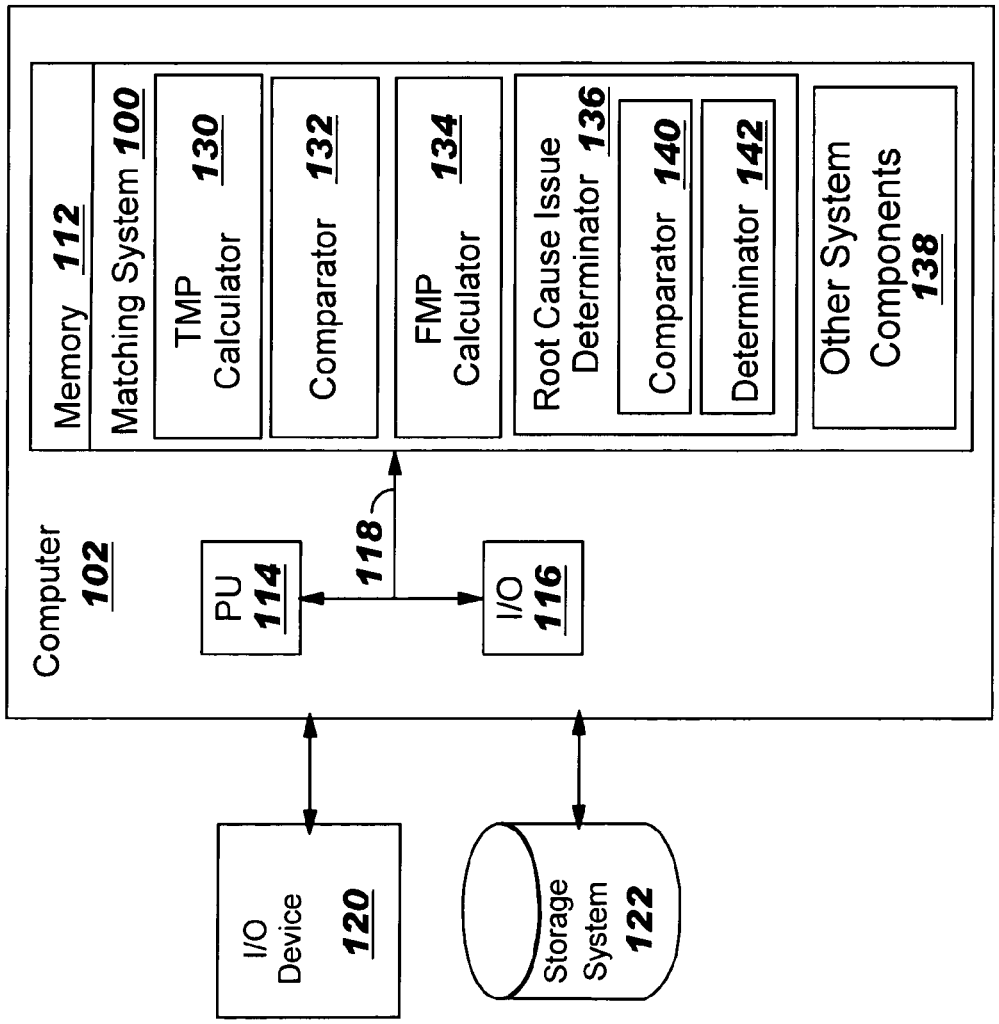
FIG. 2 shows a block diagram of a fleet matching system according to the invention.

With reference to the accompanying drawings, FIG. 2 is a block diagram of a matching system 100 in accordance with the invention. System 100 is shown implemented on computer 102 as computer program code. To this extent, computer 102 is shown including a memory 112, a processor 114, an input/output (I/O) interface 116, and a bus 118. Further, computer 102 is shown in communication with an external I/O device/resource 120 and a storage system 122. In general, processor 114 executes computer program code, such as system 100, that is stored in memory 112 and/or storage system 122. While executing computer program code, processor 114 can read and/or write data to/from memory 112, storage system 122, and/or I/O device 120. Bus 118 provides a communication link between each of the components in computer 102 and I/O device 120 can comprise any device that enables user to interact with computer 102 (e.g., keyboard, pointing device, display, etc.).

Alternatively, a user can interact with another computing device (not shown) in communication with computer 102. In this case, I/O interface 116 can comprise any device that enables computer 102 to communicate with one or more other computing devices over a network (e.g., a network system, network adapter, I/O port, modem, etc.). The network can comprise any combination of various types of communications links. For example, the network can comprise addressable connections that may utilize any combination of wireline and/or wireless transmission methods. In this instance, the computing devices (e.g., computer 102) may utilize conventional network connectivity, such as Token Ring, Ethernet, WiFi or other conventional communications standards. Further, the network can comprise one or more of any type of network, including the Internet, a wide area network (WAN), a local area network (LAN), a virtual private network (VPN), etc. Where communications occur via the Internet, connectivity could be provided by conventional TCP/IP sockets-based protocol, and a computing device could utilize an Internet service provider to establish connectivity to the Internet.

Computer 102 is only representative of various possible combinations of hardware and software. For example, processor 114 may comprise a single processing unit, or be distributed across one or more processing units in one or more locations, e.g., on a client and server. Similarly, memory 112 and/or storage system 122 may reside at one or more physical locations. Memory 112 and/or storage system 122 can comprise any combination of various types of computer-readable media and/or transmission media including magnetic media, optical media, random access memory (RAM), read only memory (ROM), a data object, etc. I/O interface 116 can comprise any system for exchanging information with one or more I/O devices. Further, it is understood that one or more additional components (e.g., system software, math co-processor, etc.) not shown in FIG. 2 can be included in computer 102. To this extent, computer 102 can comprise any type of computing device such as a network server, a desktop computer, a laptop, a handheld device, a mobile phone, a pager, a personal data assistant, etc. However, if computer 102 comprises a handheld device or the like, it is understood that one or more I/O devices (e.g., a display) and/or storage system 122 could be contained within computer 102 not externally as shown.

As discussed further below, system 100 is shown including a tool matching precision (TMP) calculator 130, a comparator 132, a fleet measurement precision (FMP) calculator 134, a root cause issue determinator 136 and other system components 138. Root cause issue determinator 136 may include a comparator 140 and a determinator 142 Other system components 138 may include any other functionality necessary for carrying out the invention and not explicitly described below.

III. Operational Methodology

Turning to FIG. 3, operational methodology according to one embodiment of the invention. The description shall refer to FIGS. 1-3 together.

There are a number of preliminary steps (not shown) that precede the inventive method. First, a benchmarking measurement system (BMS) is qualified. A "benchmarking measurement system" is a tool(s) against which a MSUT will be compared. In one embodiment, a BMS is a single trusted measurement system that has been carefully evaluated to ensure that it passes long-term precision and other tests, e.g., acceptable accuracy as measured by TMU analysis. A measurement of an MSUT of an artifact can then be compared to "benchmark measurement" of the same artifact by the BMS. Other parameters of the MSUT can also be compared to the same parameter for the BMS. In an alternative embodiment, a BMS is fleet 12. In this case, BMS values are based on average values for the fleet. For example, if each tool of the fleet made measurements at N sites on a matching artifact, the benchmark measurement of the artifact would be a fleet average measurements of the N sites on the artifact.

Second, measurement recipes for a process stress artifact(s) is established. (Can be more than one artifact.) For an MSUT with full automation, a measurement recipe is a coded set of instructions to control the system which defines where to measure and what to measure. In the absence of automation, measurement plans would be established that define where to measure and what to measure. Process stressed "artifacts" are many different semiconductor wafers at critical process steps that challenge the capabilities of an MSUT on structures and materials likely to be encountered in application targeted by the matching exercise.

Finally, the process stressed artifact(s) would be measured by the MSUT, yielding a series of measurement values that can be analyzed according to the inventive method.

Turning to the flow diagram of FIG. 3, a first step S1 of the method includes TMP calculator 130 calculating a tool matching precision (TMP) for MSUT 10. In one embodiment, TMP is based on a set of parameters including: a slope-induced shift offset (SISoffset) between a MSUT measurement of an artifact and a benchmark measurement of the artifact by a BMS and a non-linearity ($\sigma_{non-linearity}$) of a linear regression analysis comparing the MSUT and the BMS. In one embodiment, a Mandel regression analysis is employed. A "Mandel regression analysis," as introduced in 1964 and revised in 1984 by John Mandel, is a well known data analysis technique that provides a methodology of handling the least-squares fit when both variables are subject to error. One of the benefits of this more generalized regression analysis is that it can be used in all degrees of error in x and y, even the case when errors (in either or both axes) in x are zero, $\sigma_x=0$. The artifact(s) used is (are) selected depending on the particular MSUT and/or operation desired to be tested and the particular process variable considered for the measurand. The process can be repeated for a variety of different artifacts. The "measurand" is the object or feature to be measured.

By convention used in this invention, the BMS data is regressed on the MSUT data which means that the BMS data corresponds to the y-axis, while the MSUT data corresponds to the x-axis. This convention implies that the estimated slope $\hat{\beta}$ of the best-fit regression line represents a unit change in BMS measurement divided by a unit change in MSUT measurement. Other regressions that handle errors in both x and y can be used, but the Mandel regression is preferred. The Mandel regression output parameters used in this invention are the $\hat{\beta}_{MSUT}$ and the Net Residual Error (NRE), which is the square-root of the mean-square error of the sum of the squares of the residuals of the data from the best-fit line. NRE is also designated as $\sigma_{Mandel\ Residual}$. Instead of the intercept of the best-fit regression line, the average offset between the BMS and the MSUT measurements is used.

With further regard to TMP, "slope-induced shift offset" (hereinafter "SISoffset") indicates the non-unity slope penalty further away from the process window center between a MSUT measurement of an artifact and a benchmark measurement of the artifact by a BMS; and "non-linearity" indicates the amount of statistically significant scatter about the best-fit line based on the Mandel regression analysis comparing the MSUT and the BMS. In one embodiment, SISoffset may be defined as: SISoffset=ν(Process Window Size)$(1 - \hat{\beta}_{MSUT})$, where SISOffset is the slope-induced shift offset, ν is a user-selectable fraction of the process window size or range of the data, and $\hat{\beta}_{MSUT}$ is the slope of the linear (Mandel if used) regression analysis comparing the MSUT and the BMS. In one embodiment, where the Mandel regression analysis is used, the non-linearity is defined as: $\sigma_{non-linearity}^2 = \sigma_{Mandel\ Residual}^2 - \sigma_{BMS}^2 - \sigma_{MSUT}^2$, where $\sigma_{non-linearity}^2$ is the non-linearity, $\sigma_{Mandel\ Residual}^2$ is a residual of the Mandel regression analysis, $\sigma_{BMS}^2$ is a precision estimate of the benchmark measurement, and $\sigma_{MSUT}^2$ is a precision estimate of the MSUT measurement. A "precision estimate" as used herein includes a variance estimate based on the square of the precision from a respective BMS or MSUT. Ideally, the $\sigma_{BMS}^2$, the $\sigma_{MSUT}^2$, and the $\sigma_{Mandel\ Residual}^2$ should all be estimated concurrently, which maximizes the ability to statistically determine a significant $\sigma_{non-linearity}^2$ because $\sigma_{Mandel\ Residual}^2$ contains both $\sigma_{BMS}^2$ and $\sigma_{MSUT}^2$ quantities.

The SISoffset and non-linearity parameters provide a more realistic interpretation of MSUT 10 ability to match fleet 12. The set of parameters may further include: a slope ($\beta_{MSUT}$) of the Mandel regression analysis comparing the MSUT and the BMS, a precision of the MSUT ($\sigma_{MSUT}$), an average offset between the MSUT measurement of the artifact and the benchmark measurement of the artifact by the BMS, a BMS average offset (offset$_{BMS}$) between the benchmark measurement of the artifact and a fleet average measurement of the artifact, and a BMS slope-induced offset (SISoffset$_{BMS}$) between the benchmark measurement of the artifact and the fleet average measurement of the artifact.

In one embodiment, TMP is defined using this set of parameters as:

$$TMP = 3\sqrt{\beta_{MSUT}^2 \sigma_{MSUT}^2 + (offset - offset_{BMS})^2 + (SISoffset - SISoffset_{BMS})^2 + \sigma_{non-linearity}^2},$$

where TMP is the tool matching precision, $\beta_{MSUT}$ is the slope of the Mandel regression analysis, $\sigma_{MSUT}$ is the precision of the MSUT, offset is the average offset, offset$_{BMS}$ is the BMS average offset, SISoffset is the slope-induced shift offset, SISoffset$_{BMS}$ is the BMS shift-induced offset, and $\sigma_{non-linearity}$ is the non-linearity.

A special case relative to TMP is presented where fleet 12 includes only a single measurement system. In particular, the set of parameters may be reduced to include the SISoffset and non-linearity ($\sigma_{non-linearity}$), and only the slope ($\beta_{MSUT}$), precision of the MSUT ($\sigma_{MSUT}$), and average offset. In this case, TMP$_2$ can be defined as:

$$TMP_2 = 3\sqrt{\beta_{2,MSUT}^2 \sigma_{MSUT}^2 + \frac{offset_2^2}{4} + \frac{SISoffset_2^2}{4} + \frac{\sigma_{2,non-linearity}^2}{4}},$$

where TMP$_2$ is the tool matching precision, $\beta_{2,MSUT}$ is the slope of the Mandel regression analysis, $\sigma_{MSUT}$ is the precision of the MSUT, offset$_2$ is the average offset, SISoffset$_2$ is the slope-induced shift offset and $\sigma_{2,non-linearity}$ is the non-linearity. The sub-script "2" indicates only two measurement systems are being evaluated, i.e., the MSUT and the single measurement system in fleet 12.

Continuing with FIG. 3, a second step S2 includes determining whether the TMP meets a matching threshold via comparator 132. The "matching threshold" is a value that indicates acceptable matching precision for a MSUT that it is considered matched to the fleet. The matching threshold is user selected and may be defined by a specification for a fleet. The MSUT is considered matched in the case that the matching threshold is met, i.e., YES at step S2. Alternatively, if the matching threshold is not met by the TMP, i.e., NO at step S2, the MSUT is considered to have a matching problem.

In the case that the TMP meets the matching threshold, i.e., YES at step S2, this indicates that the MSUT can be used for production to measure relevant processes - step S3. That is, no matching problem exists. Subsequent to this step, a fleet measurement precision is calculated by FMP calculator 134 at step S4 for all measurement systems 14 in fleet 12. "Fleet measurement precision" (hereinafter "FMP") is a metric that provides an indication of the fleet's overall measurement precision. In one embodiment, FMP is defined as:

$$FMP = 3\sqrt{V_{pp} + V_{po} + V_{ps} + V_{pn}},$$

where $V_{pp}$ is a pooled corrected precision of all tools and MSUT (as shown in FIG. 1) in fleet 12, $V_{po}$ is a pooled average offset of all tools and MSUT (as shown in FIG. 1) in fleet 12, $V_{ps}$ is a pooled average slope-induced offset of all tools in fleet 12 and $V_{pn}$ is a pooled non-linearity of all tools and MSUT (as shown in FIG. 1) in fleet 12. The pooled corrected precision may be defined as:

$$V_{pp} = \frac{1}{N} \sum_{i=1}^{N} (\beta_{i,MSUT}^2) \sigma_{i,MSUT}^2,$$

where $V_{pp}$ is the pooled corrected precision, $\sigma_{i,MSUT}$ is a single tool precision of the ith tool, and $\beta_{i,MSUT}$ is the slope of the Mandel regression analysis of the ith tool. The pooled average offset may be defined as:

$$V_{po} = \frac{1}{N} \sum_{i=1}^{N} (offset_i - offset_{BMS})^2,$$

where $V_{po}$ is the pooled average offset, offset$_i$ is the average offset of the ith tool to the BMS and offset$_{BMS}$ is the average offset of the BMS to a fleet average. The pooled average sloped-induced offset is defined as:

$$V_{ps} = \frac{1}{N} \sum_{i=1}^{N} (SISoffset_i - SISoffset_{BMS})^2,$$

where $V_{ps}$ is the pooled average sloped-induced offset, SISoffset$_i$ is the sloped-induced offset of the ith tool to the BMS, and SISoffset$_{BMS}$ is the sloped-induced offset to the fleet average. The pooled non-linearity is defined as:

$$V_{pn} = \frac{1}{N} \sum_{i=1}^{N} \sigma_{nonlinearity,i}^2,$$

where $V_{pn}$ is the pooled non-linearity, and $\sigma_{non-linearity,i}$ is the non-linearity of the ith tool. In each of the above-described formulations, N is a number of tools in fleet 12.

Returning to step S2 in FIG. 3, in the case that TMP does not meet the matching threshold, i.e., NO at step S2, this indicates a matching problem exists. In this case, steps S5-S9 includes root cause issue determinator 136 determining a root cause issue of why TMP does not meet the matching threshold. As used herein, "root cause issue" includes a category of TMP parameters that lead to determining a root cause of a matching problem, and a "root cause" includes one or more MSUT characteristics that cause a matching problem. In one embodiment, a root cause issue is identified by identifying a TMP parameter that is more significant compared to other TMP parameters. Reviewing user-known root causes of the root cause issue can then lead to finding and/or correcting the matching problem.

Continuing with the methodology, a first step S5 includes comparator 140 determining which at least one of the following TMP parameters is more significant: i) a square of an average offset between the MSUT measurement of the artifact and the benchmark measurement of the artifact by the BMS, ii) a square of the non-linearity ($\sigma_{non-linearity}$), iii) a precision estimate ($\sigma^2_{MSUT}$) of the MSUT measurement, i.e., a square of the MSUT precision, and iv) a square of the SISoffset. As used herein, "more significant" indicates which value or values is/are the largest, or, if the inverses of the values are used, which is/are the smallest. The number of root cause issues selected can be user selected. Although a separate comparator 140 has been illustrated, it should be recognized that functioning may be shared with comparator 132.

Next, in steps S6-S9, determninator 142 determines a root cause issue of the matching problem includes: i) an offset issue, in step S6, in the case that the square of an average offset is more significant, ii) a non-linearity issue, in step S7, in the case that the square of the non-linearity ($\sigma_{non-linearity}$) is more significant, iii) a stability issue, in step S8, in the case that the precision estimate ($\sigma_{MSUT}^2$) is more significant, and iv) an SISoffset issue, in step S9, in the case that the square of the SISoffset is more significant.

Each root cause issue of a matching problem delineated above has a corresponding one or more MSUT characteristics that are known root causes of the root cause issue. At step S10, these root cause issues are presented to a user, e.g., via I/O device 120, for evaluation by a user, so that the user can manually determine the root cause by evaluating one or more MSUT characteristics that are known root causes of the root cause issue. When the root causes are determined by the user, they can lead to modifications to attempt to correct the matching problem depending on the type of MSUT. Examples of root causes of a measurement system problem are, for example, a calibration, a hardware module, equipment setup, and an operating environment.

The above-described process is executed for the entire set of artifacts. In the end, when all artifacts have been run, a summarization of the matching contributor magnitudes and the FMP is available. An evaluation of trends can then be completed. For example, some matching issues may be artifact and feature specific and some matching issues may be common across the fleet. By summarizing FMP and the magnitudes of each matching contributor for all artifacts, one can easily identify these artifact specific or common fleet issues and drive the proper resolution.

IV. Conclusion

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention could be utilized. The present invention also can be embedded in a computer program product or a propagated signal, which comprises all the respective features enabling the implementation of the methods described herein, and which—when loaded in a computer system —is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of determining whether a measurement system under test (MSUT) matches a fleet including at least one other measurement system, the method comprising the steps of:

calculating a tool matching precision based on a set of parameters including: a slope-induced shift offset (SISOffset) between a MSUT measurement of an artifact and a benchmark measurement of the artifact by a benchmark measurement system (BMS) and a non-linearity ($\sigma_{non-linearity}$) of a linear regression analysis comparing the MSUT and the BMS, wherein the slope-induced shift offset is defined as:

SISoffset=$\upsilon$(Process Window Size)(1-$\beta_{MSUT}$), where SISOffset is the slope-induced shift offset, $\upsilon$ is a user-selectable fraction of a process window size or range of the data, and $\beta_{MSUT}$ is a slope of the linear regression analysis comparing the MSUT and the BMS; and determining whether the tool matching precision meets a matching threshold, wherein the MSUT is considered matched in the case that the matching threshold is met.

2. The method of claim 1, wherein the set of parameters further includes:

a slope of the linear regression analysis comparing the MSUT and the BMS, a precision of the MSUT, an average offset between the MSUT measurement of the artifact and the benchmark measurement of the artifact by the BMS, a BMS average offset between the benchmark measurement of the artifact and a fleet average measurement of the artifact, and a BMS slope-induced offset between the benchmark measurement of the artifact and the fleet average measurement of the artifact.

3. The method of claim 2, wherein the calculating step defines the tool matching precision as:

$$TMP = 3\sqrt{\beta_{MSUT}^2 \sigma_{MSUT}^2 + (offset - offset_{BMS})^2 + (SISoffset - SISoffset_{BMS})^2 + \sigma_{non-linearity}^2}$$

where TMP is the tool matching precision, $\beta_{MSUT}$ is the slope of the linear regression analysis, $\sigma_{MSUT}$ is the precision of the MSUT, offset is the average offset, $offset_{BMS}$ is the BMS average offset, SISoffset is the slope-induced shift offset, $SISoffset_{BMS}$ is the BMS shift-induced offset, and $\sigma_{non-linearity}$ is the non-linearity.

4. The method of claim 1, wherein, in the case that the fleet only includes one other measurement system, the set of parameters further includes:
 a slope of the linear regression analysis comparing the MSUT and the BMS,
 a precision of the MSUT, and
 an average offset between the MSUT measurement of the artifact and the benchmark measurement of the artifact by the BMS.

5. The method of claim 4, wherein the calculating step defines the tool matching precision as:

$$TMP_2 = 3\sqrt{\beta_{2,MSUT}^2 \sigma_{MSUT}^2 + \frac{offset_2^2}{4} + \frac{SISoffset_2^2}{4} + \frac{\sigma_{2,non-linearity}^2}{4}}$$

where $TMP_2$ is the tool matching precision, $\beta_{2,MSUT}$ is the slope of the linear regression analysis, $\sigma_{MSUT}$ is the precision of the MSUT, $offset_2$ is the average offset, $SISoffset_2$ is the slope-induced shift offset and $\sigma_{2,non-linearity}$ is the non-linearity.

6. The method of claim 1, wherein the calculating step employs a Mandel regression analysis, and defines the non-linearity as:

$$\sigma_{non-linearity}^2 = \sigma_{Mandel\ Residual}^2 - \sigma_{BMS}^2 - \sigma_{MSUT}^2,$$

where $\sigma_{non-linearity}^2$ is the non-linearity, $\sigma_{Mandel\ Residual}^2$ is a residual of the Mandel regression analysis, $\sigma_{BMS}^2$ is a precision estimate of the benchmark measurement, and $\sigma_{MSUT}^2$ is a precision estimate of the MSUT measurement.

7. The method of claim 1, wherein the BMS is one of: a) the fleet, in which case the benchmark measurement is a fleet average measurement, and b) a single trusted measurement system.

8. The method of claim 1, wherein in the case that the tool matching precision meets the matching threshold, the method further includes the step of determining a fleet measurement precision as:

$$FMP = 3\sqrt{V_{pp} + V_{po} + V_{ps} + V_{pn}},$$

where $V_{pp}$ is a pooled corrected precision of all tools in the fleet, $V_{po}$ is a pooled average offset of all tools in the fleet, $V_{ps}$ is a pooled average slope-induced offset of all tools in the fleet and $V_{pn}$ is a pooled non-linearity of all tools in the fleet.

9. The method of claim 8, wherein:
a) the pooled corrected precision is defined as:

$$V_{pp} = \frac{1}{N}\sum_{i=1}^{N}(\beta_{i,MSUT}^2)\sigma_{i,MSUT}^2,$$

where $V_{pp}$ is the pooled corrected precision, $\sigma_{i,MSUT}$ is a single tool precision of the ith tool, $\beta_{i,MSUT}$ is the slope of the linear regression analysis of the ith tool;

b) the pooled average offset is defined as:

$$V_{po} = \frac{1}{N}\sum_{i=1}^{N}(offset_i - offset_{BMS})^2,$$

where $V_{po}$ is the pooled average offset, $offset_i$ is the average offset of the ith tool to the BMS and $offset_{BMS}$ is the average offset of the BMS to a fleet average;

c) the pooled average sloped-induced offset is defined as:

$$V_{ps} = \frac{1}{N}\sum_{i=1}^{N}(SISoffset_i - SISoffset_{BMS})^2,$$

where $V_{ps}$ is the pooled average sloped-induced offset, $SISoffset_i$ is the sloped-induced offset of the ith tool to the BMS, and $SISoffset_{BMS}$ is the sloped-induced offset to the fleet average; and d) the pooled non-linearity is defined as:

$$V_{pn} = \frac{1}{N}\sum_{i=1}^{N}\sigma_{nonlinearity,i}^2,$$

where $V_{pn}$ is the pooled non-linearity, and $\sigma_{non-linearity,i}$ is the non-linearity of the ith tool; and wherein N in each expression is a number of tools in the fleet.

10. The method of claim 1, wherein in the case that the tool matching precision does not meet the matching threshold, the method further includes the step of determining a root cause of why the tool matching precision does not meet the matching threshold.

11. The method of claim 10, wherein the root cause determining step includes:
 a) determining which at least one of the following is more significant:
  i) a square of an average offset between the MSUT measurement of the artifact and the benchmark measurement of the artifact by the BMS,
  ii) a square of the non-linearity (σnon-linearity),
  iii) a precision estimate σ2MSUT) of the MSUT measurement, and
  iv) a square of the SISoffset;
 b) determining a root cause issue is:
  i) an offset issue in the case that the square of an average offset is the more significant,
  ii) a non-linearity issue in the case that the square of the non-linearity (σnon-linearity) is more significant,
  iii) a stability issue in the case that the precision estimate (σ2MSUT) is more significant, and iv) an SISoffset issue in the case that the square of the SISoffset is more significant; and c) determining the root cause by evaluating at least one MSUT characteristic that is known to cause the root cause issue.

12. A system for determining whether a measurement system under test (MSUT) matches a fleet including at least one other measurement system, the system comprising:

means for calculating a tool matching precision based on a set of parameters including: a slope-induced shift offset (SISOffset) between a MSUT measurement of an artifact and a benchmark measurement of the artifact by a benchmark measurement system (BMS) and a non-linearity ($\sigma_{non-linearity}$) of a Mandel regression analysis comparing the MSUT and the BMS;

means for determining whether the tool matching precision meets a matching threshold, wherein the MSUT is considered matched in the case that the matching threshold is met; and means for determining a fleet measurement precision for the case that the tool matching precision meets the matching threshold, wherein fleet measurement precision is defined as:

$$FMP = 3\sqrt{V_{pp} + V_{po} + V_{ps} + V_{pn}},$$

where $V_{pp}$ is a pooled corrected precision of all tools in the fleet, $V_{po}$ is a pooled average offset of all tools in the fleet, $V_{ps}$ is a pooled average slope-induced offset of all tools in the fleet and $V_{pn}$ is a pooled non-linearity of all tools in the fleet.

13. The system of claim 12, wherein the set of parameters further includes:

a slope of the Mandel regression analysis comparing the MSUT and the BMS, a precision of the MSUT, an average offset between the MSUT measurement of the artifact and the benchmark measurement of the artifact by the BMS, a BMS average offset between the benchmark measurement of the artifact and a fleet average measurement of the artifact, and a BMS slope-induced offset between the benchmark measurement of the artifact and the fleet average measurement of the artifact.

14. The system of claim 13, wherein the calculating means defines the tool matching precision as:

$$TMP = 3\sqrt{\beta_{MSUT}^2 \sigma_{MSUT}^2 + (\text{offset} - \text{offset}_{BMS})^2 + (SISoffset - SISoffset_{BMS})^2 + \sigma_{non-linearity}^2}$$

where TMP is the tool matching precision, $\beta_{MSUT}$ is the slope of the Mandel regression analysis, $\sigma_{MSUT}$ is the precision of the MSUT, offset is the average offset, offset$_{BMS}$ is the BMS average offset, SISoffset is the slope-induced shift offset, SISoffset$_{BMS}$ is the BMS shift-induced offset, and $\sigma_{non-linearity}$ is the non-linearity.

15. The system of claim 12, wherein the BMS is one of: a) the fleet, in which case the benchmark measurement is a fleet average measurement, and b) a single trusted measurement system.

16. The system of claim 12, further comprising means for determining a root cause issue of why the tool matching precision does not meet the matching threshold in the case that the tool matching precision does not meet the matching threshold.

17. The system of claim 16, wherein the root cause issue determining means includes:

a) means for determining which at least one of the following is more significant:
   i) a square of an average offset between the MSUT measurement of the artifact and the benchmark measurement of the artifact by the BMS,
   ii) a square of the non-linearity ($\sigma_{non-linearity}$),
   iii) a precision estimate ($\sigma_{MSUT}^2$) of the MSUT measurement, and
   iv) a square of the SISoffset;

b) means for determining a root cause issue is:
   i) an offset issue in the case that the square of an average offset is more significant,
   ii) a non-linearity issue in the case that the square of the non-linearity ($\sigma$non-linearity) is more significant,
   iii) a stability issue in the case that the precision estimate ($\sigma$2MSUT) is more significant, and
   iv) an SISoffset issue in the case that the square of the SISoffset is more significant.

18. A program product stored on a computer readable medium for determining whether a measurement system under test (MSUT) matches a fleet including at least one other measurement system, the computer readable medium comprising program code for performing the following steps:

calculating a tool matching precision based on a set of parameters including:

a slope-induced shift offset (SISOffset) between a MSUT measurement of an artifact and a benchmark measurement of the artifact by a benchmark measurement system (BMS), a non-linearity ($\sigma_{non-linearity}$) of a Mandel regression analysis comparing the MSUT and the BMS, and a slope of the Mandel regression analysis comparing the MSUT and the BMS, a precision of the MSUT, an average offset between the MSUT measurement of the artifact and the benchmark measurement of the artifact by the BMS, a BMS average offset between the benchmark measurement of the artifact and a fleet average measurement of the artifact, and a BMS slope-induced offset between the benchmark measurement of the artifact and the fleet average measurement of the artifact, wherein the calculating means defines the tool matching precision as:

$$TMP = 3\sqrt{\beta_{MSUT}^2 \sigma_{MSUT}^2 + (\text{offset} - \text{offset}_{BMS})^2 + (SISoffset - SISoffset_{BMS})^2 + \sigma_{non-linearity}^2}$$

where TMP is the tool matching precision, $\beta_{MSUT}$ is the slope of the Mandel regression analysis, $\sigma_{MSUT}$ is the precision of the MSUT, offset is the average offset, offset$_{BMS}$ is the BMS average offset, SISoffset is the slope-induced shift offset, SISoffset$_{BMS}$ is the BMS shift-induced offset, and $\sigma_{non-linearity}$ is the non-linearity; and determining whether the tool matching precision meets a matching threshold, wherein the MSUT is considered matched in the case that the matching threshold is met.

19. The program product of claim 18, further comprising determining a fleet measurement precision for the case that the tool matching precision meets the matching threshold, wherein fleet measurement precision is defined as:

$$FMP = 3\sqrt{V_{pp} + V_{po} + V_{ps} + V_{pn}},$$

where $V_{pp}$ is a pooled corrected precision of all tools in the fleet, $V_{po}$ is a pooled average offset of all tools in the fleet, $V_{ps}$ is a pooled average slope-induced offset of all tools in the fleet and $V_{pn}$ is a pooled non-linearity of all tools in the fleet.

20. The program product of claim 18, further comprising determining a root cause issue of why the tool matching precision does not meet the matching threshold in the case that the tool matching precision does not meet the matching threshold.

21. A method of determining a root cause issue of a matching problem between a measurement system under test (MSUT) and a fleet of at least one other measurement system, the method comprising the steps of:
 calculating a tool matching precision indicative of an ability of the MSUT to match the fleet;
 determining that the tool matching precision does not meet a matching threshold; and
 determining the root cause issue of the matching problem based on an analysis of at least one parameter of the tool matching precision, including
 a) determining which at least one of the following is more significant:
  i) a square of an average offset between the MSUT measurement of the artifact and the benchmark measurement of the artifact by the BMS,
  ii) a square of the non-linearity ($\sigma_{non-linearity}$),
  iii) a precision estimate ($\sigma_{MSUT}^2$) of the MSUT measurement, and iv) a square of the SISoffset;
 b) determining a root cause issue is:
  i) an offset issue in the case that the square of an average offset is more significant,
  ii) a non-linearity issue in the case that the square of the non-linearity ($\sigma$non-linearity) is more significant,
  iii) a stability issue in the case that the precision estimate ($\sigma$2MSUT) is more significant, and
  iv) an SISoffset issue in the case that the square of the SISoffset is more significant.

22. The method of claim 21, wherein the calculating step defines the tool matching precision as:

$$TMP = 3\sqrt{\beta_{MSUT}^2 \sigma_{MSUT}^2 + (\text{offset} - \text{offset}_{BMS})^2 + (SISoffset - SISoffset_{BMS})^2 + \sigma_{non-linearity}^2}$$

where TMP is the tool matching precision, $\beta_{MSUT}$ is a slope of a Mandel regression analysis comparing the MSUT and a benchmarking measurement system (BMS), $\sigma_{MSUT}$ is a precision of the MSUT, offset is an average offset between an MSUT measurement of an artifact and a benchmark measurement of the artifact by the BMS, offset$_{BMS}$ is a BMS average offset between the benchmark measurement of the artifact and a fleet average measurement of the artifact, SISoffset is a slope-induced shift offset (SISOffset) between the MSUT measurement of the artifact and the benchmark measurement of the artifact by the BMS, SISoffset$_{BMS}$ is a BMS slope-induced offset between the benchmark measurement of the artifact and the fleet average measurement of the artifact, and $\sigma_{non-linearity}$ is the non-linearity of the Mandel regression analysis.

23. The method of claim 21, wherein the BMS is one of: a) the fleet, in which case the benchmark measurement is a fleet average measurement, and b) a single trusted measurement system.

* * * * *